(12) United States Patent
Petersen et al.

(10) Patent No.: US 7,813,407 B2
(45) Date of Patent: Oct. 12, 2010

(54) SEGMENTED DIODE LASER SYSTEM

(75) Inventors: Paul Michael Petersen, Hillerød (DK); Birgitte Thestrup Nielsen, Jyllinge (DK)

(73) Assignee: Danmarks Tekniske Universitet, Lyngby (DK)

( * ) Notice: Subject to any disclaimer, the term of this patent is extended or adjusted under 35 U.S.C. 154(b) by 222 days.

(21) Appl. No.: 11/629,530

(22) PCT Filed: Jun. 16, 2005

(86) PCT No.: PCT/DK2005/000393
§ 371 (c)(1),
(2), (4) Date: Jul. 13, 2007

(87) PCT Pub. No.: WO2005/124953
PCT Pub. Date: Dec. 29, 2005

(65) Prior Publication Data
US 2007/0291812 A1    Dec. 20, 2007

(30) Foreign Application Priority Data
Jun. 16, 2004  (DK) .............................. 2004 00934

(51) Int. Cl.
*H01S 3/08* (2006.01)
(52) U.S. Cl. ....................................... 372/103; 372/92
(58) Field of Classification Search .................. 372/103, 372/50.121, 29.011, 92; 359/341.1
See application file for complete search history.

(56) References Cited

U.S. PATENT DOCUMENTS

| | | | |
|---|---|---|---|
| 4,995,050 A | 2/1991 | Warrts et al. | |
| 5,594,744 A | 1/1997 | Lefevre et al. | |
| 6,192,062 B1 | 2/2001 | Sanchez-Rubio et al. | |
| 6,212,216 B1 | 4/2001 | Pillai | |
| 6,215,595 B1 * | 4/2001 | Yamazaki et al. | ........... 359/623 |
| 2007/0291812 A1 | 12/2007 | Peterson et al. | |
| 2009/0245305 A1 | 10/2009 | Jensen et al. | |

FOREIGN PATENT DOCUMENTS

JP    03 142988    6/1991

(Continued)

OTHER PUBLICATIONS

V. Daneu et al., "Spectral beam combining of a broad stripe diode array in an external cavity," Optics Letters, vol. 25, No. 6, Mar. 15, 2000.*

(Continued)

*Primary Examiner*—Minsun Harvey
*Assistant Examiner*—Tuan N. Nguyen
(74) *Attorney, Agent, or Firm*—Finnegan, Henderson, Farabow, Garrett, & Dunner, L.L.P.

(57) ABSTRACT

Disclosed is a laser system that comprises a laser source adapted to emit a laser beam, wherein the laser source comprises a plurality of emitters for emitting respective beam contributions to the emitted laser beam; and first and second feedback means adapted to provide optical feedback to respective first and second parts of the emitted laser beam. The first feedback means is adapted to predominantly feed back a respective angular/directional contribution of each of said beam contributions into a corresponding one of the plurality of emitters from which said angular/directional contribution was emitted at a predetermined output angle, to cause each of the plurality of emitters to predominantly emit a beam contribution towards the second feedback means at an angle corresponding to the predetermined output angle.

16 Claims, 7 Drawing Sheets

FOREIGN PATENT DOCUMENTS

| | | |
|---|---|---|
| JP | 05 206579 | 8/1993 |
| JP | 05 206580 | 8/1993 |
| WO | WO 98 56087 | 12/1998 |
| WO | WO 02/21651 A1 * | 3/2002 |
| WO | WO 02/101895 A2 | 12/2002 |
| WO | WO 03/036766 A2 * | 5/2003 |
| WO | WO 03/084006 A2 | 10/2003 |
| WO | WO 2007/068245 | 6/2007 |

OTHER PUBLICATIONS

V. Daneu et al., "Spectral beam combining of a broad-stripe diode laser array in an external cavity," Optics Letters, vol. 25, No. 6, Mar. 15, 2000.

Jensen et al., "Stability of the Single-Mode Output of a Laser Diode Array with Phase Conjugate Feedback," Applied Physics Letters, American Institute of Physics, New York, US, vol. 76, No. 5 (2000), pp. 535-537.

MacCormack et al., "High-Brightness Output from a Laser Diode Array Coupled to a Phase-Conjugating Mirror," Optics Letters, Optical Society of America, vol. 18, No. 3 (1993), pp. 211-213.

M.G. Litman et al., "Spectrally Narrow Pulsed Dye Laser Without Beam Expander," Applied Optics, vol. 17, bo. 14, (1978), pp. 2224-2227.

Non-final Office Action mailed by the USPTO on Feb. 23, 2010 in U.S. Appl. No. 12/086,412, filed Nov. 5, 2008.

* cited by examiner

SEGMENTED DIODE LASER SYSTEM

This invention relates to laser systems and, more particularly, to laser systems comprising segmented diode lasers.

Laser diodes are well known as reasonably priced, small and robust sources of laser beams. Conventional laser diodes with small output power and good coherence properties have been available, and they are used in many applications such as CD players, bar-code readers etc.

More recently, laser diodes with a narrow and long light emitting area that provide several Watts of output power have become available. These broad-area high-power laser diodes are potentially applicable in industrial areas requiring high power light sources, such as in printing, material processing, medicine, optical sensors and pumping of high-power single mode active waveguides. However, as the optical quality of these lasers is not sufficiently good for many applications, it is desirable to improve the optical quality of high-power laser diodes.

In particular, the light beam emitted from such diodes with a long light emitting stripe is difficult to focus to a small spot size in the direction of the stripe. The direction of the stripe is referred to as the slow axis, while the direction across the stripe is referred to as the fast axis.

Published international application WO 02/21651 discloses a laser system with off-axis feedback that improves the spatial properties of the generated laser beam compared to a freely running diode laser.

Published international application WO 03/084006 discloses a laser system with two off-axis feedback arms.

The desire to increase the output power of diode laser devices has led to the development of segmented laser sources, such as laser diode bars. Such laser diode bars comprise a number of spatially separated diode lasers that form a plurality of optically independent emitters. The light emitting areas of the individual emitters are arranged side by side on an output facet of the laser diode bar. Typically, each of the light emitting areas is an elongated area having a long dimension along the so-called slow axis and a short dimension along the so-called fast axis substantially perpendicular to the slow axis; both the slow and the fast axis lie substantially in the plane defined by the output facet of the laser source. In a laser diode bar, the individual emitters are typically arranged such that their respective slow axes are aligned with each other lengthwise along the bar, resulting in a large total output area and correspondingly in a large output power.

Unfortunately, the above feedback mechanisms for conventional diode lasers have been found of limited use for segmented diode lasers, because it has proven difficult to provide sufficiently selective feedback for all individual diode arrays.

WO 03/036766 discloses a laser system that comprises a segmented laser source resulting a primary beam having a twin-lobe far-field distribution. The beam is focussed on a grating. From there, one of the two lobes passes through a spatial filter onto an output coupler that reflects a feedback portion of the lobe and transmits an output portion of the lobe as the output of the laser system. The second lobe passes from the grating to a mirror from which it is reflected as feedback.

Even though the above prior art system suggests a feedback mechanism for segmented diode lasers, it remains a problem to further improve the spatial properties, in particular the spatial coherence, of the output laser beam.

The above and other problems are solved by a laser system comprising a laser source adapted to emit a laser beam, wherein the laser source comprises a plurality of emitters for emitting respective beam contributions to the emitted laser beam, wherein the emitted laser beam has a spatial light distribution around an optical axis of the laser beam, and first and second feedback means adapted to provide optical feedback to respective first and second parts of the emitted laser beam back into the laser source at respective feedback angles relative to the optical axis, wherein the first feedback means comprises a first diffractive element adapted to generate a first diffracted beam from the first part of the emitted laser beam and a first reflective element adapted to reflect a feedback part of the first diffracted beam back onto the first diffractive element and to generate an output beam from an output part of the first diffracted beam, when the second feedback means comprises a spatial filter adapted to prevent at least a central portion of of the spatial light distribution proximal to the optical axis from being fed back into the laser source.

It has been realised by the inventors that by placing a spatial filter in the resonant cavity of the second feedback arm rather than in the resonant cavity of the first feedback arm from which the output beam is derived, the spatial properties of the laser system are significantly improved. It is believed that this improvement is caused by the fact that the spatial filtering of the second feedback arm has a greater selective effect on the spatial modes, since the second feedback arm provides the strongest feedback compared to the first feedback arm which generates the output beam and, thus, only feeds back a rather small portion of the laser beam.

It has turned out that a particularly high output quality is achieved when the filter is adapted to block at least the innermost portions of the laser beam, i.e. the part that is proximal to the optical axis.

When the first feedback means is adapted to predominantly feed back a respective angular/directional contribution of each of said beam contributions into a corresponding one of the plurality of emitters from which said angular/directional contribution was emitted at a predetermined output angle, to cause each of the plurality of emitters to predominantly emit a beam contribution towards the second feedback means at an angle corresponding to the predetermined output angle.

When the first feedback means is adapted to feed back a respective angular/directional contribution of each of said beam contributions into a corresponding one of the plurality of emitters from which said angular/directional contribution was emitted at a predetermined direction, the preferred directions of emission of each of the emitters are aligned with respect to each other, even though the contributions from the individual emitters are incoherent with respect to each other. In particular, each emitter is caused to predominantly emit at an emission angle corresponding to the incident angle of the selected feedback beam contribution. It has turned out that this alignment considerably improves the efficiency and selectivity of the off-axis feedback in the second feed-back circuit and, thus, the spatial properties of the resulting output beam.

Consequently, it is an advantage of the invention that it improves the spatial coherence of the beam at the second feedback means.

Here, the term predominantly feeding back is intended to refer to a selective feedback of a predetermined angular/directional contribution. It is understood, however, that other directional contributions may experience some feedback as well, but to a considerably lesser degree, preferably lesser by a factor of 5 or more.

The spatial properties of the output laser beam are considerably improved when one of the feedback means comprises a diffractive element, such as a grating, adapted to generate a diffracted beam from a part of the emitted laser beam, and a reflective element adapted to reflect at least a part of the diffracted beam back onto the diffractive element.

The combination of the reflective element and the diffractive element in of the first feedback means causes the light emitted from a predetermined region of the light-emitting area, e.g. from one of the emitters of a segmented diode laser, to be predominantly fed back into the same region and substantially at the same angle. Consequently, the preferred directions of emission of the different regions are aligned with respect to each other, thereby improving the efficiency of the feedback in the second feedback means.

In a particularly preferred embodiment, the first reflective element is adapted to reflect at least a part of the first-order contribution of the first diffracted beam back onto the diffractive element. As the first-order contribution of the diffracted beam shows dispersion, reflecting the first-order contribution provides a wavelength-selective feedback by the first reflective element in cooperation with the diffractive element.

In a further preferred embodiment the diffractive element is adapted to emit more optical power in the first-order contribution of the diffractive beam than in the zero-order contribution of the diffractive beam, thereby further increasing the efficiency of the feedback and the emitted power of the laser system.

In a yet further preferred embodiment, the reflective element of the first feedback is adapted to reflect a part of the diffracted beam that is emitted from the diffractive element at a predetermined angle, thereby selecting different wavelengths for the different regions of the light-emitting area of the laser source, and assuring a co-directional propagation of the beam components from the different regions. In one embodiment, the first reflective element is a plane reflecting plate.

The first reflective element is adapted to reflect a feedback part of the first diffracted beam back into the diffractive member and to generate an output beam from an output part of the first diffracted beam. Hence, the first reflective element functions as an output coupler.

In another preferred embodiment, the laser system further comprises a Fourier lens located in the beam path of the emitted laser beam and defining a Fourier plane; and the diffractive element is positioned substantially in the Fourier plane, thereby increasing the efficiency of the wavelength and direction selectivity of the diffractive element and the reflective element. Since the first feedback circuit ensures that the beams corresponding to the selected modes emitted from the individual emitters are co-directional, these beams are all focused into two well-defined spots in the Fourier plane and on respective sides of the optical axis, thereby allowing an effective spatial filtering in the second feedback circuit and, thus, an efficient and selective feedback. Preferably, the system further comprises a lens for collimating the fast axis.

The laser source comprises a plurality of emitters for emitting respective contributions to the emitted laser beam, such as a diode laser array, a diode laser bar, a segmented diode laser, or the like. In particular, in such a multi-emitter system that generates a plurality of incoherent laser beams, it has turned out that an alignment of the predominant emission directions of the individual emitters with respect to each other considerably improves the efficiency and selectivity of the feedback system, thereby improving the quality of the output beam.

As mentioned above, the emitted laser beam includes respective contributions from the different light emitters of the laser source. Correspondingly, the spatial distribution of the emitted laser beam is a combined intensity distribution pattern having multiple combined lobes corresponding to the multiple lobes of the individual contributions. The combined lobes are positioned off-axis on either side of the optical or principal axis of the laser source, which optical axis projects substantially perpendicular out of an output face of the laser source. The multiple spatial lobes of the individual emitters correspond to respective multiple spatial modes of the individual emitters.

In another preferred embodiment, the second feedback means is adapted to feed back one or more predetermined spatial modes of each contribution of the emitted laser beam, thereby improving the spatial properties of the output beam. In a further preferred embodiment, the second feedback means comprises a second reflective member, preferably in combination with the spatial filter for efficiently selecting one or more predetermined modes.

It has surprisingly further turned out that, when the second feedback means including said spatial filter is adapted to selectively feed back one or more spatial modes that are present in the freely running laser source, the spatial properties of this system are improved. Here the term freely running laser is intended to refer to the laser source when operated without any feedback means.

Even though the feedback may be provided to more than one spatial modes it is preferred to substantially feedback a single spatial mode, as such selective feedback results in the largest improvement of the spatial coherence of the output beam.

In a particularly preferred embodiment, the second feedback means comprises a second reflective element including a reflective surface area; and wherein the spatial filter is formed by an edge portion of said reflective surface area proximal to the optical axis. The second reflective element is positioned in the beam path on one side of the optical axis such that the edge portion proximal to the optical axis has a predetermined angular distance from the optical axis. Consequently, only a predetermined angular portion of the emitted beam corresponding to an angle larger than a predetermined lower cut-off angle relative to the optical axis is reflected and fed back into the laser source by the second reflective element, while the central beam contributions of the twin-lobe intensity distribution are filtered out. It is an advantage of this arrangement that not additional blocking filter parts for blocking the central beam parts from reaching the mirror are needed, since such additional filter parts may block other parts of the emitted beam, and thus prevent a proper alignment of the laser system. In some embodiments, the spatial filter further blocks the angular beam contributions above a predetermined upper cut-off angle, i.e. the outermost beam portion.

In another embodiment, the reflectivity of the first reflective element is between about 5-25%, causing between about 75-95% of the light that reaches the first reflective element to be transmitted as an output beam.

It has turned out that in some situations, e.g. in case of a particularly precise alignment of the laser system and/or in combination with high gain lasers, the reflectivity of the reflective element may be reduced, e.g. below 10%, thus increasing the output power while maintaining a high beam quality.

Accordingly, in one embodiment, the reflectivity of the first reflective element is between about 1-25%, e.g. between 1-5%, between 5-8%, between 5-9%, between 5-10%, or between 5-15% and wherein the first reflective element is adapted to substantially cause the corresponding remaining fraction of the light that reaches the first reflective element to be transmitted as an output beam.

In one embodiment the reflectivity of the second reflective element is larger than 95%, preferably larger than 98%, most preferably larger than 99%, thereby providing a strong feedback.

Preferably, the laser system further comprises a Fourier lens located in the beam path of the emitted laser beam and defining a Fourier plane; and the second feedback means is positioned substantially in the Fourier plane of the Fourier lens. Since the different spatial modes of the emitted laser beam are emitted at respective angles, they are spatially separated in the Fourier plane, thereby facilitating an efficient mode-selective feedback. In a particularly preferred embodiment, the selection of a predetermined spatial mode is performed by a spatial filter placed substantially in the Fourier plane.

In another preferred embodiment, the second feedback means comprises a second diffractive element adapted to generate a second diffracted beam from the second part of the emitted laser beam and the second reflective element is adapted to reflect at least a part of the second diffracted beam back onto the second diffractive element. Preferably, the second reflective element is positioned in the beam path of the first-order contribution of the diffractive beam. Consequently, the second feedback means further provides a wavelength and direction sensitive feedback.

In yet another preferred embodiment, the first and second diffractive members are the same diffractive member, thereby reducing the number of required components and providing a particularly compact setup. Accordingly, in some embodiments, the first diffractive element and the second diffractive element are embodied as a single diffractive element adapted to diffract the emitted laser beam resulting in a combined diffracted beam; wherein the first reflective element is positioned in the path of a first lobe of the diffracted combined intensity distribution, and wherein the second reflective element is positioned in the path of a second lobe of the combined intensity distribution on the opposite side of the optical axis from said first lobe.

In a further preferred embodiment, an additional spatial filtering in the first feedback arm may be provided. Hence, in some embodiments, the first feedback means comprises an additional spatial filter adapted to block spatial modes of the first diffracted beam which spatial modes correspond to angular contributions having an angle relative to the optical axis that is smaller than a lower cut-off angle, thereby further increasing the efficiency and selectivity of the feedback system.

Further preferred embodiments are disclosed in the dependant claims.

The above and other aspects of the invention will be apparent and elucidated from the embodiments described in the following with reference to the drawing in which.

In the drawings, like reference signs correspond to like or similar components, elements, or the like.

Figure 1A:
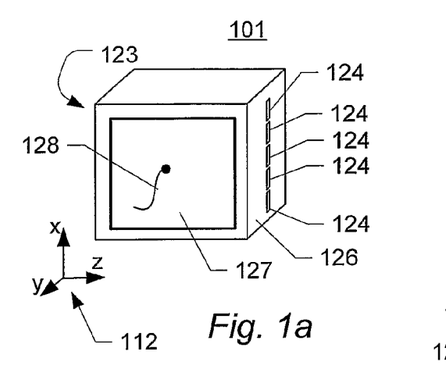
FIG. 1 shows a schematic view of a segmented diode laser.
Figure 1B:
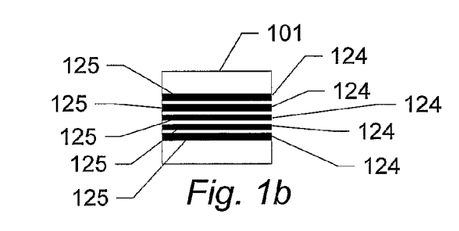

FIG. 1 shows a schematic view of a segmented diode laser. FIG. 1a shows a perspective view of a laser diode and FIG. 1b shows a cross section of a laser diode. Generally, in a segmented laser diode, the emitter stripe is segmented into a number of segments 124, i.e. the emitter stripe comprises a number of regions that are separated by non-emitting areas. For this purpose, the emitter is divided into several subsections 125, e.g. by the introduction of damages into the lasing material or by introducing such periods into the electrodes 127. Hence, the light-emitting facet 126, or so-called front facet, of the laser diode comprises a sequence of several emitters 124 placed next to each other. This results in a light emitting area on the front facet that has considerably larger dimension in the direction of the sequence of emitters (the direction of the x-axis of the coordinate system 112 in FIG. 1) than in the direction orthogonal to the direction of emitters (the direction of the y-axis), i.e. in a broad-area emitter. For example, the total length of the segmented stripe in x-direction may be several hundreds of micrometers, or even up to several millimeters, e.g. 0.5-3 mm, while the width of the stripe in the direction of the y-axis is typically of the order of a few micrometers, e.g. 0.5-5 μm.

Typically, the back facet 123 of the laser diode is coated with a highly reflective coating, while the front facet is coated with a partially reflective coating.

During operation, a drive current is applied to the electrodes 127 via electrical contacts 128. Consequently, such a broad area stripe results in the emission of a large optical power from the diode. However, the emitted spatial properties of the emitted beam quality in the direction of the stripe (x-direction), the so-called slow axis, is considerably lower than in the direction across the stripe (y-direction), the so-called fast axis.

In the direction of the slow-axis the light distribution of each contribution of the emitted beam has a broad structure that is a result of a superposition of a plurality of spatial or transverse modes, where each mode has a twin lobe structure with respective lobes at each side of the optical axis. Each transverse mode predominantly radiates at a corresponding emission angle resulting in a broad overall light distribution.

A measure of the quality of a laser beam is the beam quality factor $M^2$. A beam having an ideal Gaussian beam profile corresponds to a beam quality factor of $M^2=1$, while $M^2$ becomes larger for beams with a beam profile different from a standard Gaussian beam. The typical $M^2$ values of the low coherence axis of conventional high-power multimode laser diodes range from ten to several hundred, while the $M^2$ value of the high coherence axis typically is close to one.

Figure 2:
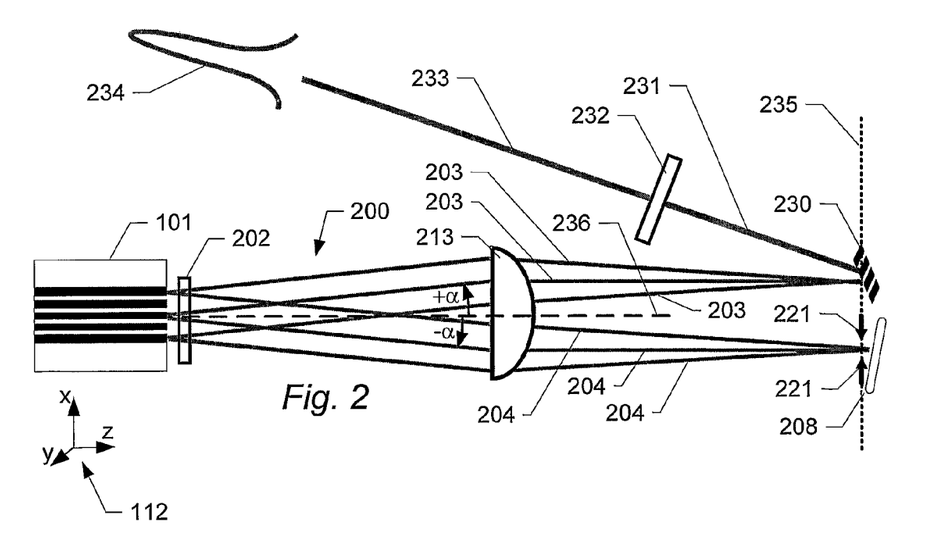
FIG. 2 shows a schematic view of an embodiment of a laser system comprising a grating and a mirror.

FIG. 2 shows a schematic view of an embodiment of a laser system comprising a grating and a mirror. The laser system comprises a segmented, broad-area diode laser 101, e.g. a diode laser as shown in FIG. 1. The laser diode emits a laser beam 200 having a slow axis in the plane of the drawing (x-direction) and a fast axis pointing out of the plane of the drawing (y-direction). The laser system further comprises a micro lens 202 attached to the front facet of the diode laser 101. The micro lens collimates the emitted laser beam 200 along the fast axis. The laser system further comprises a cylinder lens 213 for collimating/focusing the emitted laser beam 200 along the slow axis. As described above, the laser diode 101 emits a laser beam that has a broad intensity distribution along the slow axis corresponding to a superposition of a plurality of spatial modes from each emitter with twin lobe structures around the optical axis 236. In FIG. 2 this is illustrated by beam paths 203 and 204 representing respective lobes of the twin-lobe distribution emitted from the individual emitters. The cylinder lens is adapted to operate as a Fourier lens defining a Fourier plane as indicated by dotted line 235 at a distance of 2f from the diode laser, where f is the focal length of the cylinder lens 213. The laser system further comprises two optical feedback circuits: A first optical feedback circuit comprises a grating 230 and a partially reflecting mirror 232, while a second feedback circuit comprises a reflector 208, e.g. a mirror, providing optical feedback to a part of the laser beam that corresponds to a part of one of the lobes. The second feedback circuit further comprises a spatial filter 221, e.g. an aperture, a slit, or the like, allowing a more efficient selection of one or more individual spatial modes of the multi-mode structure. Preferably, the spatial filter 221 and the grating 230 are placed in or at least proximate to the Fourier plane.

The off-axis feedback in one lobe 204 causes predominantly one spatial frequency mode of the multimode beam from each emitter to be selected and to be fed back into the active area of the laser. The feedback causes the other lobe 203 (i.e. the output lobe) of the selected mode to be amplified and all other array modes to be effectively suppressed. Consequently, the spatial coherence of each of the segments in the segmented bar is improved using off-axis feedback. Hence, the off-axis feedback is also referred to as off-axis self-injection locking. It is noted that the beam contributions from the individual emitters overlap and may be temporally incoherent with respect to each other. In this embodiment, the off-axis feedback is provided by the mirror 208 and the spatial filter 221 in or close to the Fourier plane 235. However, it is understood that the off-axis feedback system may be implemented in a number of ways. For example, the spatial filter and the reflector may be integrated in a single element, e.g. by coating a part of a mirror, by using a narrow mirror stripe with a sharp edge, or the like. The mirror or the mirror stripe may be plane, curved, or the like. In order to achieve efficient off-axis feedback from the second feedback circuit, it is desirable that the mirror 208 has a high reflectivity close to 100%. It has turned out that particularly effective off-axis feedback is obtained when the spatial selective feedback from the second feedback circuit feds back part of the individual emitters own spatial modes.

As mentioned above, the first feedback circuit comprises the grating 230 and the partly transmitting mirror 232. The grating 230 is placed in the Fourier plane 235 and is configured to receive one lobe 203 of the emitted laser beam. In the embodiment of FIG. 2, this is achieved by providing a narrow grating placed in the Fourier plane. Alternatively or additionally, the laser system may include a further spatial filter for limiting the light received by the grating to one of the lobes. The grating diffracts the received beam resulting in a diffracted beam having a zero-order component (not shown in FIG. 2) and a first-order component 231 emitted at respective angles from the grating. The partly transmitting mirror 232 is placed as to reflect the first-order component 231 of the diffracted beam back onto the grating. Consequently, the grating diffracts the reflected beam back into the laser diode 101. The mirror 232 is partly reflecting and partly transmitting causing a part of the first-order diffracted component 231 to be output from the laser system as an output beam 233. The partly transmitting mirror 232 preferably reflects 10%-25% of the diffracted beam 231 and transmits 90%-75%.

In the Fourier plane 235, each of the beams 203 from a corresponding emitter position is incident at a specific angle. The grating 230 diffracts the various wavelengths in the emitter beam into slightly different angles, because the angle at which the first-order diffracted beam is emitted depends on the wavelength and on the incident angle of the beam components. The mirror 232 causes only light at a specific angle and, therefore, a specific wavelength to be coupled back via the grating into the emitter. Consequently, the combination of the grating 230 and the mirror 232 selects different wavelengths for the various emitters and assures co-directional propagation of the individual beams. Furthermore, since the reflected light is again diffracted by the grating 230 into the laser diode, the contributions from each emitter are diffracted back into the same emitter. Hence, each emitter predominantly emits a corresponding beam contribution at an angle $-\alpha$ with respect to the optical axis 236, where the angle is determined by the incident angle $+\alpha$ of the corresponding feedback beam.

It is noted that the grating 230 is used in a so-called Littman configuration (see e.g. M. G. Littman et al., "Spectrally narrow pulsed dye laser without beam expander", Applied optics, Vol. 17, Bo. 14, p. 2224-2227). Preferably, the grating 230 is adapted to emit more optical power in the first-order contribution of the diffractive beam than in the zero-order contribution of the diffractive beam. For example, the grating may be a surface relief grating, e.g. produced by holographic or direct laser writing in photoresist, where the structure is subsequently transferred to, e.g., a polymer or glass material by a replication process. Other examples of suitable gratings include so-called blazed gratings.

Hence, the first feedback circuit effectively selects a given direction of the emitted beams from all the individual elements in the bar, thereby causing the beams corresponding to the selected modes from all emitters to be imaged in a single spot in the Fourier plane. This in turn leads to an improved spatial filtering in the second off-axis feedback cavity.

Furthermore, since the mirror 232 also functions as an output coupler, the various beams 203 from the individual emitters overlap in the output beam 233.

The beam combining effect of a grating and an output coupler on a diode laser array is described as such in "Spectral beam combining of a broad-stripe diode laser array in an external cavity", by V. Daneu et al., Optics Letters, Vol. 25, No. 6, 2000. According to the embodiments of the present invention, the grating and the output coupler are used in an off-axis configuration where they are adapted to feed back a part of the laser beam only. Due to the combination of the off-axis feedback and the direction-selective feedback, the output beam 233 has a narrow spatial distribution that can be focused to a small spot size, as illustrated by the curve 234. It is noted that the laser system described herein leads to a spatial coherence of the overall output beam that is even better than the spatial coherence of the individual elements in the segmented diode, in contrast to the method suggested by Daneu et al (ibid) where the overall improvement cannot be better than the spatial coherence of each element.

Figure 3:
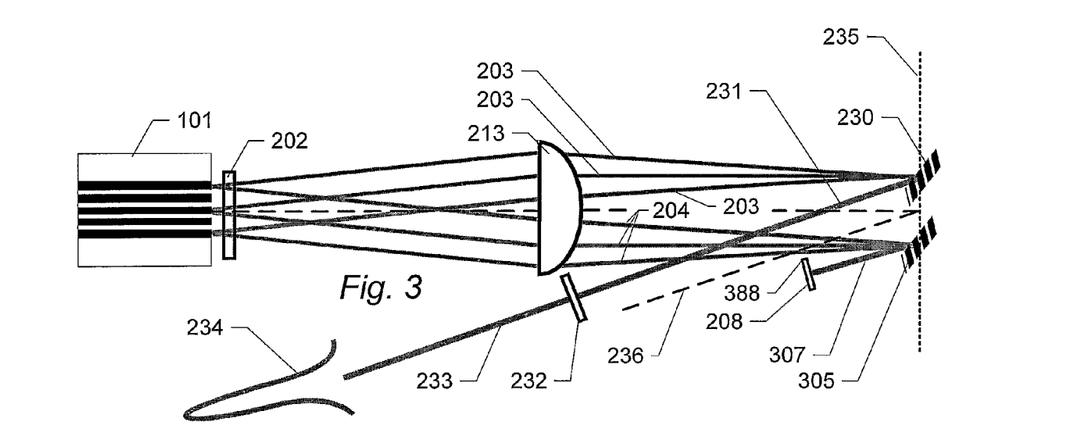
FIG. 3 shows a schematic view of another embodiment of a laser system comprising two gratings.

FIG. 3 shows a schematic view of another embodiment of a laser system. The laser system of FIG. 3 is similar to the system shown in FIG. 2, and the corresponding components will not be described again in detail. However, in this embodiment, the second feedback circuit also comprises a grating 305 placed in the Fourier plane 235, and the mirror 208 of the second off-axis feedback circuit placed in the first-order diffracted beam generated by the grating 305. Furthermore, in this embodiment, the output coupler 232 is placed on the other side of the optical axis as in FIG. 2. Hence both feedback circuits utilise a first-order diffraction beam of lobes 203 and 204, respectively, on the same side with respect to a normal on the Fourier plane 235.

Preferably, the mirror 208 is placed as close to the Fourier plane as possible, i.e. close to the grating. In one embodiment, the mirror 208 is a narrow mirror stripe. Spatial filtering of the emitted laser beams in the second feedback arm is advantageous, since the strongest feedback (close to 100%) is obtained in this arm. Especially, it is desirable to have a spatial filter effect in the innermost part of the beam path 307 in order to suppress unwanted feedback effects from spatial frequency modes in the central part of the first order diffracted beams. Such a filtering effect is easily achieved by providing the mirror 208 with a sharp edge 388. If the mirror 208 consists of a mirror stripe, a spatial filter effect both in the innermost part and in the outermost part of the beam path 307 is obtained without blocking other parts of the laser beams. The term innermost is intended to refer to the part of the laser beam proximal to the optical axis 236, and the term outermost is intended to relate to the part of the beam distal to the optical axis 236.

Alternatively or additionally, spatial filtering may be achieved by providing the grating 305 as a narrow stripe and/or by placing an additional spatial filter in front of the grating 305 or between the grating 305 and the mirror 208.

Hence, in this embodiment, off-axis self-injection locking is provided for each emitter in the segmented diode laser 101. The combination of the grating and the mirror assures that part of the light from each emitter is fed back into the same emitter.

As in the embodiment of FIG. 1, the first feedback circuit of this embodiment comprises a grating 230 placed in the Fourier plane and a partly transmitting mirror 232 placed in the first-order diffracted beam 231 as described above.

Figure 4:
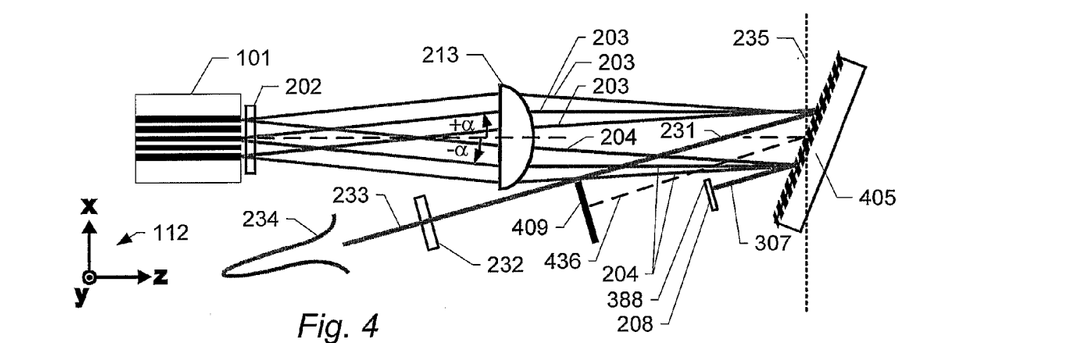
FIG. 4 shows a schematic view of yet another embodiment of a laser system comprising a single grating.

FIG. 4 shows a schematic view of yet another embodiment of a laser system comprising a single grating. This embodiment is similar to the embodiment of FIG. 3, and the corresponding components will not be described again in detail. However, in this embodiment the two gratings are replaced by a single grating 405, thereby reducing the number of components and providing a more compact setup. Furthermore, use of a single grating provides a higher stability against vibrations, temperature fluctuations etc.

The laser system further comprises a filter 409 placed in the beam path of the diffracted beam as to block the centre part of the first-order diffracted beam. It has turned out that spatial filtering in the first feedback arm is less important, since this arm has a significant weaker feedback effect (10%-25%). However, in addition to spatial filtering in the second feedback arm, spatial filtering in the first feedback arm improves to some extent the beam quality of the output beam even further. Such a filtering effect is obtained, e.g., by the filter 409 that blocks, predominantly, mode lobes from spatial frequency modes in the central part of the first order diffracted beams. It is also possible to apply the laser system with an additional spatial filtering of the outermost part of the diffracted beam 231. This can have a minor effect on the beam quality of the output beam (<2% improvement). However, in practice it can be difficult to apply the laser system with such a filter without blocking part of the output beam. Preferably, the filter 409 is placed after, i.e. downstream from, the mirror 208 and as close to the mirror 208 as possible without obstructing other parts of the beam path. The filter 409 assures that only light from one lobe 203 reaches the mirror 232, thereby improving the selectivity of the feedback. Preferably, the mirror 232 is placed sufficiently far away from the grating 405 to provide a sufficiently high angular selectivity. Furthermore, it is preferred that mirror 208 is placed as close to the Fourier plane 235 as possible, as the effect of mirror 208 is the improvement of the coherence of the individual emitters rather than wavelength multiplexing. As explained above, the mirror 208 is preferably provided with a sharp innermost edge 388, thereby blocking the central part of the intensity distribution, i.e. spatial modes having a small angular distance from the optical/principal axis 436 of the multi-lobe distribution pattern. In a preferred embodiment, mirror 208 is a small mirror stripe with a central/innermost sharp edge 388 and, preferably a peripheral/outermost sharp edge.

Figure 5:
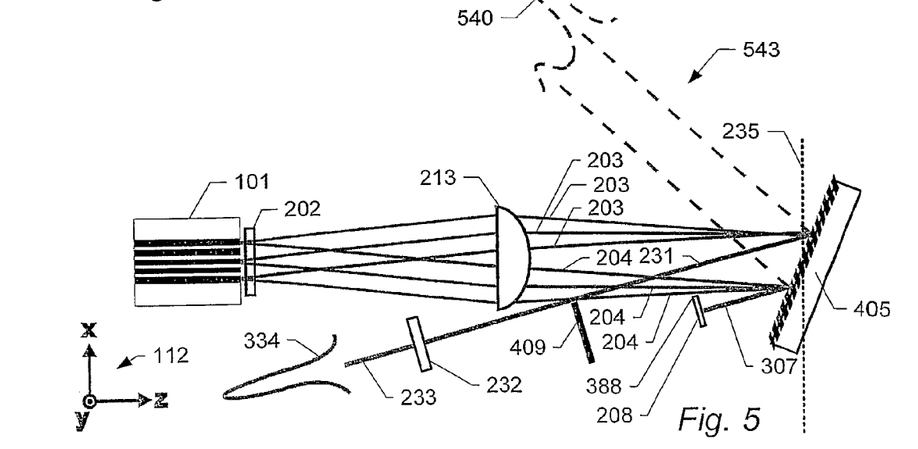
FIG. 5 shows a schematic view of an example of an experimental setup for analysing the laser system of FIG. 4.

FIG. 5 shows a schematic view of an example of an experimental setup for analysing the laser system of FIG. 4.

In this example, the diode laser 101 is a 808 nm, 5 W broad-stripe laser with an active volume of 500 μm×1 μm×1 mm divided into 5 emitters. The cylindrical lens 213 has a focal length of f=80 mm, the grating 405 is a gold grating with a reciprocal fringe spacing of 1200 fringes/mm and with 86% diffraction efficiency. The output coupler 232 is a partially reflecting plane mirror with 75% transmission and 25% reflection. The mirror 208 is a gold mirror placed partly in the first order diffracted beam close to the Fourier plane.

The setup of FIG. 5 was used to obtain intensity profiles along the slow axis of the output beam 233. For this purpose a beam analyzer (not shown in FIG. 5) was placed in the output beam path. Furthermore, intensity profiles 540 along the slow axis of the zero-order beam 543 diffracted by the grating were analysed. For this purpose, a beam analyser (not shown in FIG. 5) was placed in the beam path of the zero-order beam 543. Measurements of the zero-order beam allow a measurement of the entire intensity profile including both lobes.

Furthermore, the output beam 233 was focused in the slow axis with a cylindrical lens (f=50 mm) (not shown in FIG. 5) in order to measure the beam quality using the $M^2$ value. The $M^2$ value is determined by measuring the FWHM beam diameter D or the $1/e^2$ beam diameter $D_e$ versus the distance z from an arbitrary reference plane, when moving the beam analyzer through the focus point over a distance in the order of a Rayleigh range. The data were then fitted with the following equations:

$$D_e(z) = [D_0^2 + (4M^2\lambda/(\pi D_0))^2 \times (z-z_0)^2]^{1/2} \text{ and}$$

$$D(z) = [D_H^2 + (\ln 2/2)^2 \times (4M^2\lambda/(\pi D_H))^2 \times (z-z_0)^2]^{1/2}$$

Here, $\lambda$=808 nm, $D_H$ is the FWHM beam waist diameter, $D_0$ is the beam waist diameter at the $1/e^2$ level, and $z_0$ is the beam waist position.

Examples of the $M^2$ measurements are given in the following table:

| Current [A] | Setup | Output power [W] | $M^2_{50\%}$ | $M^2_{13.5\%}$ |
|---|---|---|---|---|
| 1.6 | FR | 0.078 | 25.9 ± 3.8 | — |
| | PPFB | 0.338 | 3.87 ± 0.52 | 6.98 ± 1.29 |
| | MPPFB | 0.257 | 1.56 ± 0.24 | 3.01 ± 0.18 |
| 2.2 | FR | 0.696 | — | — |
| | PPFB | — | — | — |
| | MPPFB | 0.590 | 1.92 ± 0.27 | 2.50 ± 0.31 |

The acronyms in the second column headed "Setup" refer to the different forms of feedback that were active in the different measurements:

FR: Freely running, i.e. the laser diode without any feedback,

PPFB: Feedback from plane plate 232 only, i.e. the setup of FIG. 5 with mirror 208 removed.

MPPFB: Feedback from both mirror 208 and plane plate 232, i.e. as in FIG. 5.

The column headed "Output power" corresponds to the output power in the first-order diffracted beam 233.

Hence, the above table shows that the laser system with off-axis feedback and the direction-sensitive feedback from the grating and mirror combination considerably reduces the $M^2$.

In FIGS. 6 through 9 Intensity distributions of the slow axis at beam waist for the output beam 233 and at the 0-th order beam 543 in the setup of FIG. 5 and with different forms of feedback are shown.

Figure 6:
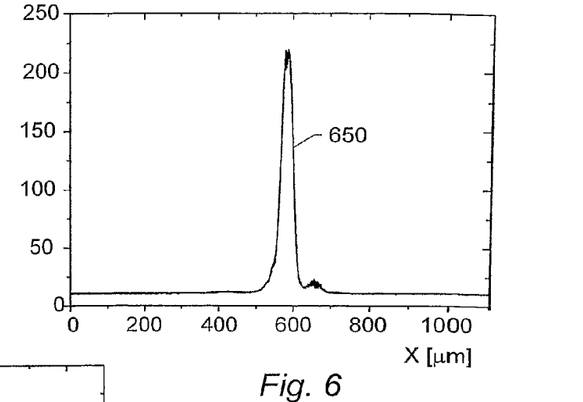
FIG. 6 shows the intensity profile of the output beam of the system of FIG. 5.

FIG. 6 shows the intensity profile of the output beam at beam waist of the system of FIG. 5 measured at I=2200 mA. The curve 650 is the beam intensity in arbitrary units as a function of the radial displacement from an arbitrary reference point. The slow axis was focused with an f=50 mm lens; and the output power was 0.59 W.

Figure 7:
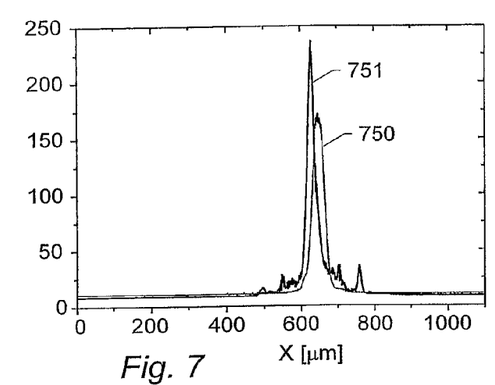
FIG. 7 shows a comparison of the intensity profile of the output beam of the system of FIG. 5 with and without the feedback mirror, respectively.

FIG. 7 shows a comparison of the intensity profile of the output beam of the system of FIG. 5 with and without the mirror 208, respectively.

The intensity profiles 750 and 751 of the output beam were measured at beam waist for the slow axis at I=1600 mA. Curve 751 shows the intensity profile of the output beam when only the feedback from the plane plate 232 is active, i.e. with the mirror 208 removed from the system. Curve 750 shows the intensity profile with feedback from both the mirror 280 and the plane plate 232 as in FIG. 5. The intensity profiles 750 and 751 are plotted in arbitrary units versus the radial displacement from an arbitrary reference point. Hence, the absolute heights of the curves are not comparable. The slow axis was focused with an f=50 mm lens.

Figure 8:
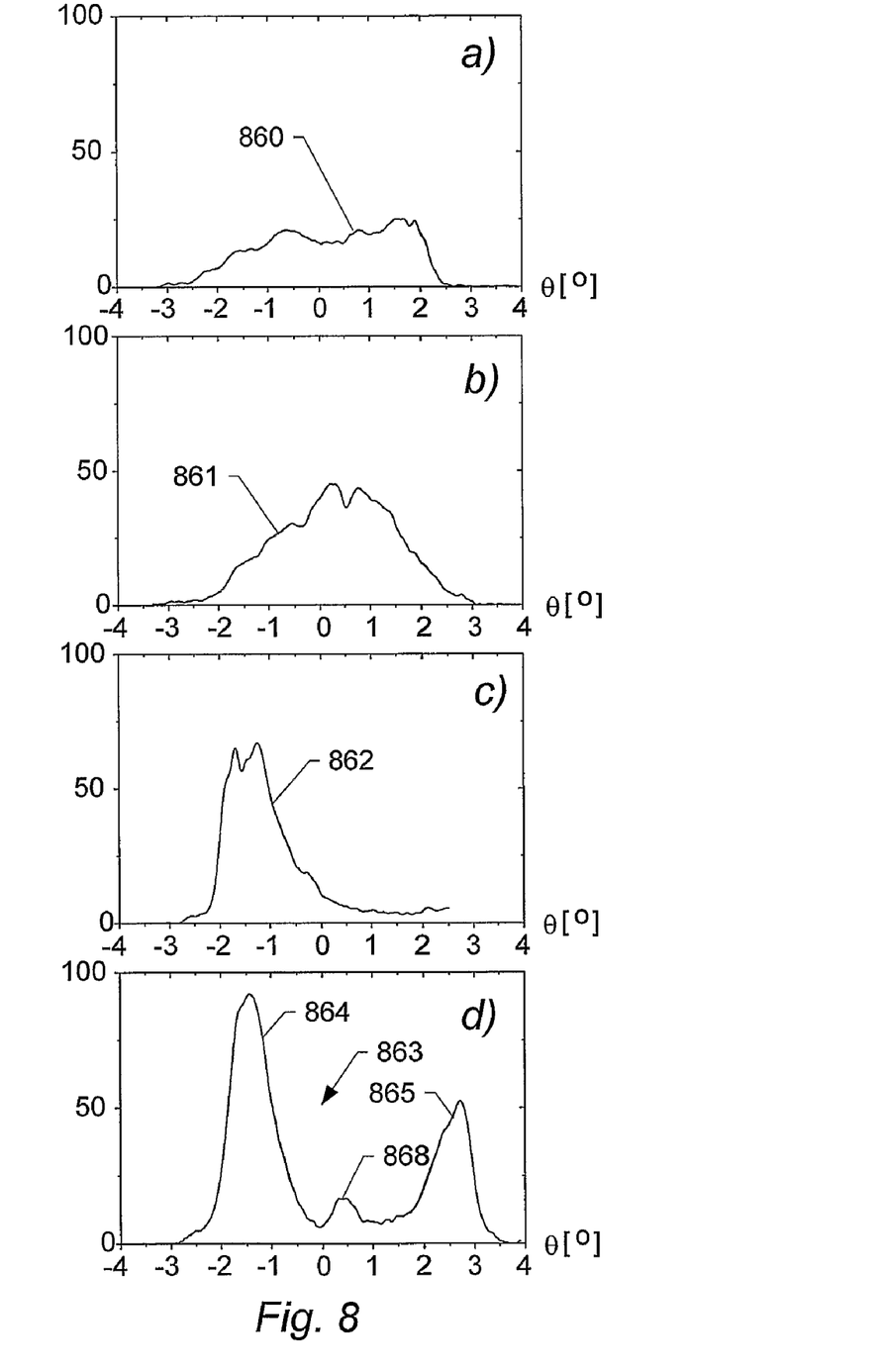
FIG. 8 illustrates the intensity profiles of the $0^{th}$ order beam in the system of FIG. 5 with and without the different feedback components and for a first drive current.

FIG. 8 illustrates the intensity profiles of the $0^{th}$ order beam along the slow axis in the system of FIG. 5 with and without the different feedback components and for a drive current of I=2200 mA. Intensities are plotted in arbitrary units vs. the angular displacement from optical axis.

FIG. 8a shows the intensity profile 860 of the freely running laser, i.e. with both the plane plate 232 and the mirror 208 removed from the system. The intensity profile is rather broad as explained above.

FIG. 8b shows the intensity profile 861 of the laser system with feedback from the plane plate 232 only, i.e. with the mirror 208 removed.

FIG. 8c shows the intensity profile 862 of the laser system with feedback from the mirror stripe 208 only, i.e. with the plane plate 232 removed.

FIG. 8d shows the intensity profile 863 of the laser system with feedback from both the plane plate 232 and the mirror stripe 208. The intensity profile 863 shows a small centre peak 868 caused by a non-optimal anti-reflection coating on the laser diode facet. Hence, this peak can be removed or even eliminated by using an optimised anti-reflection coating.

As can be clearly seen from FIG. 8, the intensity profile of the laser system with feedback from both the plane plate 232 and the mirror stripe 208 shows two narrow peaks 864 and 865 with the optical power of the beam predominantly concentrated inside the peaks.

Figure 9:
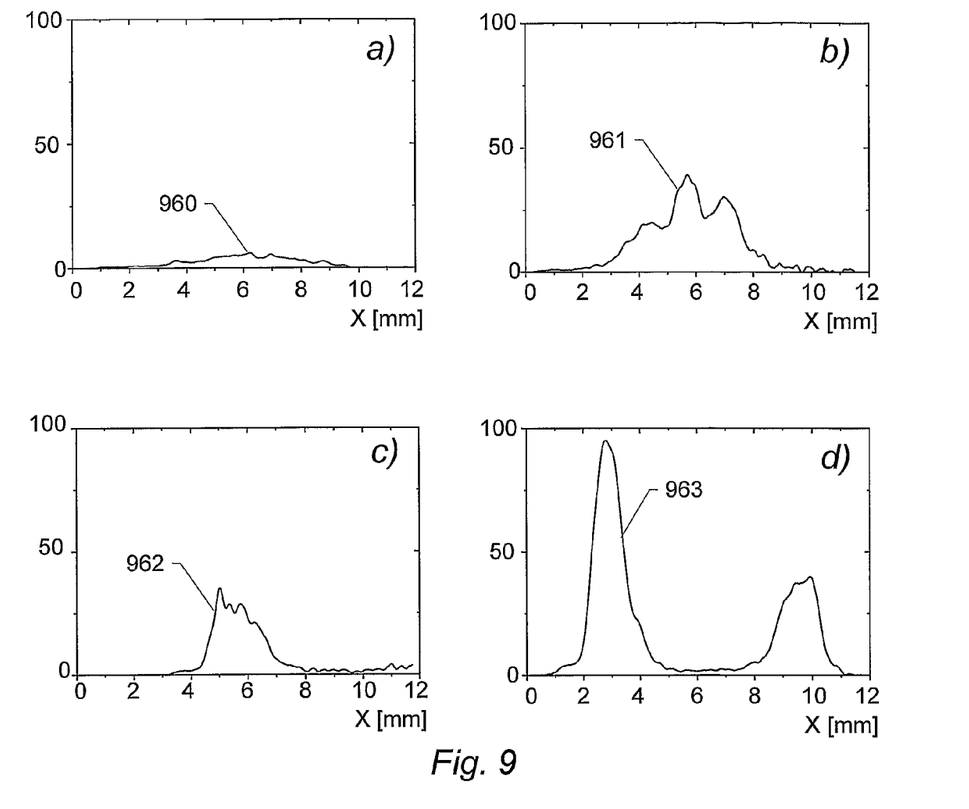
FIG. 9 illustrates the intensity profiles of the $0^{th}$ order beam in the system of FIG. 5 with and without the different feedback components and for a second drive current.

FIG. 9 illustrates the intensity profiles of the $0^{th}$ order beam along the slow axis in the system of FIG. 5 with and without the different feedback components and for a drive current of I=1600 mA, i.e. just above the threshold current of the laser diode. Intensities are plotted in arbitrary units vs. the angular displacement from an arbitrary reference point.

FIG. 9a shows the intensity profile 960 of the freely running laser, i.e. with both the plane plate 232 and the mirror 208 removed from the system.

FIG. 9b shows the intensity profile 961 of the laser system with feedback from the plane plate 232 only, i.e. with the mirror 208 removed.

FIG. 9c shows the intensity profile 962 of the laser system with feedback from the mirror stripe 208 only, i.e. with the plane plate 232 removed.

FIG. 9d shows the intensity profile 963 of the laser system with feedback from both the plane plate 232 and the mirror stripe 208.

A comparison of FIGS. 8 and 9 shows that the beam quality at smaller drive currents is better. However, as mentioned above, the beam quality at higher drive currents may be improved by optimising the anti-reflection coating on the laser diode facet.

Figure 10:
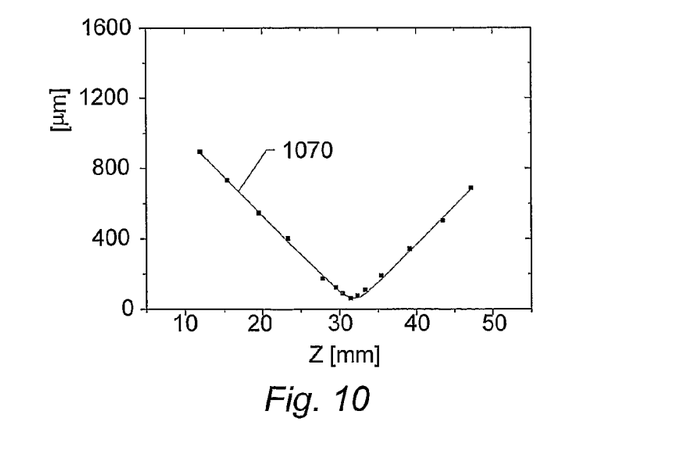
FIG. 10 shows an example of slow axis beam measurements of the output beam of the system of FIG. 5.

FIG. 10 shows an example of slow axis beam measurements of the output beam of the system of FIG. 5. The individual points in the graph of FIG. 10 are slow axis beam width measurements ($1/e^2$ level) of the output beam after an additional focusing lens (f=50 mm). The curve 1070 shows a curve fit from which the $M^2$ value is obtained. The measurements were done at an output power of 0.59 W and a drive current of I=2.2 A The data is fitted with: $D_e(z)=[D_0^2+(4M^2\lambda/(\pi D_0))^2 \times (z-z_0)^2]^{1/2}$ resulting in $M^2_{13.5\%}=2.50+/-0.31$.

Figure 11:
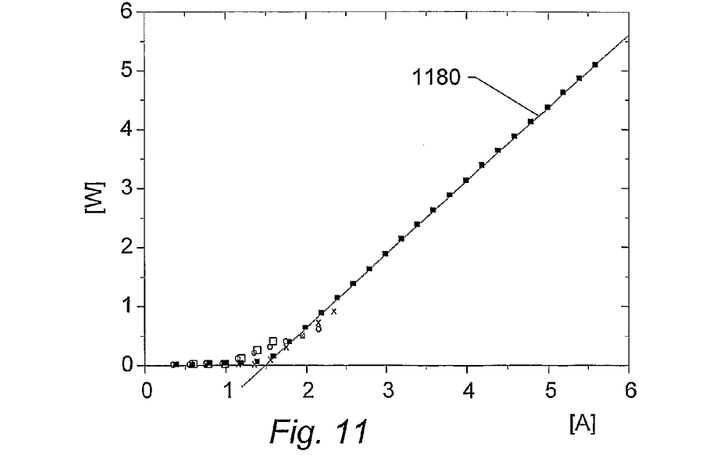
FIG. 11 shows the light-current characteristics of the output beam with and without feedback from the optical components.

FIG. 11 shows the light-current characteristics of the initial laser beam and of the output beam with and without feedback from the optical components;

The filled squares (■) correspond to the freely running laser, and the linear fit 1180 results in a slope efficiency of 1.24 W/A and a threshold current of 1.49 A.

The crosses (X) correspond to the first-order diffracted beam of the freely running laser. The open squares (□) correspond to the first-order diffracted beam with feedback from the plane plate 232 only. The open circles (○) correspond to the first-order diffracted beam with feedback from the plane plate and the mirror 208.

Figure 12:
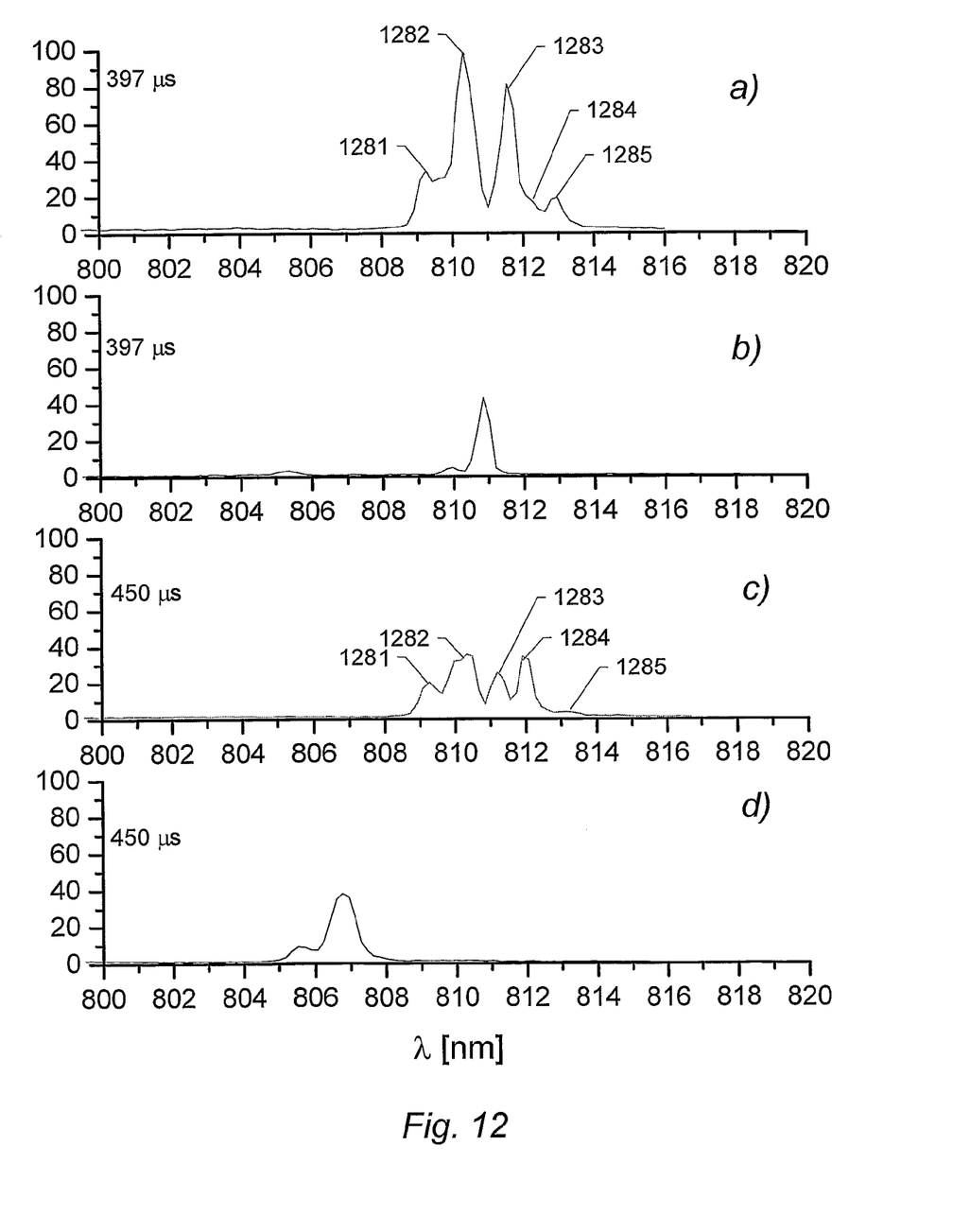
FIG. 12 shows the spectra of the output beam with and without feedback from the optical components and for the first drive current.

FIG. 12 shows the spectra of the zero order beam with and without feedback from the optical components and for a drive current of I=2.2 A. The curves show beam intensities (in arbitrary units) vs. wavelength for the zero-order beam 543 in the setup of FIG. 5.

FIG. 12a shows the intensity vs. wavelength of the laser system with feedback from both the plane plate 232 and the mirror stripe 208. The curve shows five peaks 1281, 1282, 1283, 1284, 1285, one for each of the five different wavelengths that the respective emitters of the laser diode are locked to by the laser system, as described herein.

FIG. 12*b* shows the intensity vs. wavelength of the laser system with feedback from the mirror stripe 208 only, i.e. with the plane plate 232 removed. Since the plane plate was removed, the five peaks are not visible.

FIG. 12*c* shows the intensity vs. wavelength of the laser system with feedback from the plane plate 232 only, i.e. with the mirror 208 removed. The curve shows the five peaks 1281, 1282, 1283, 1284, 1285.

FIG. 12*d* shows the intensity vs. wavelength of the freely running laser, i.e. with both the plane plate 232 and the mirror 208 removed from the system.

Figure 13:
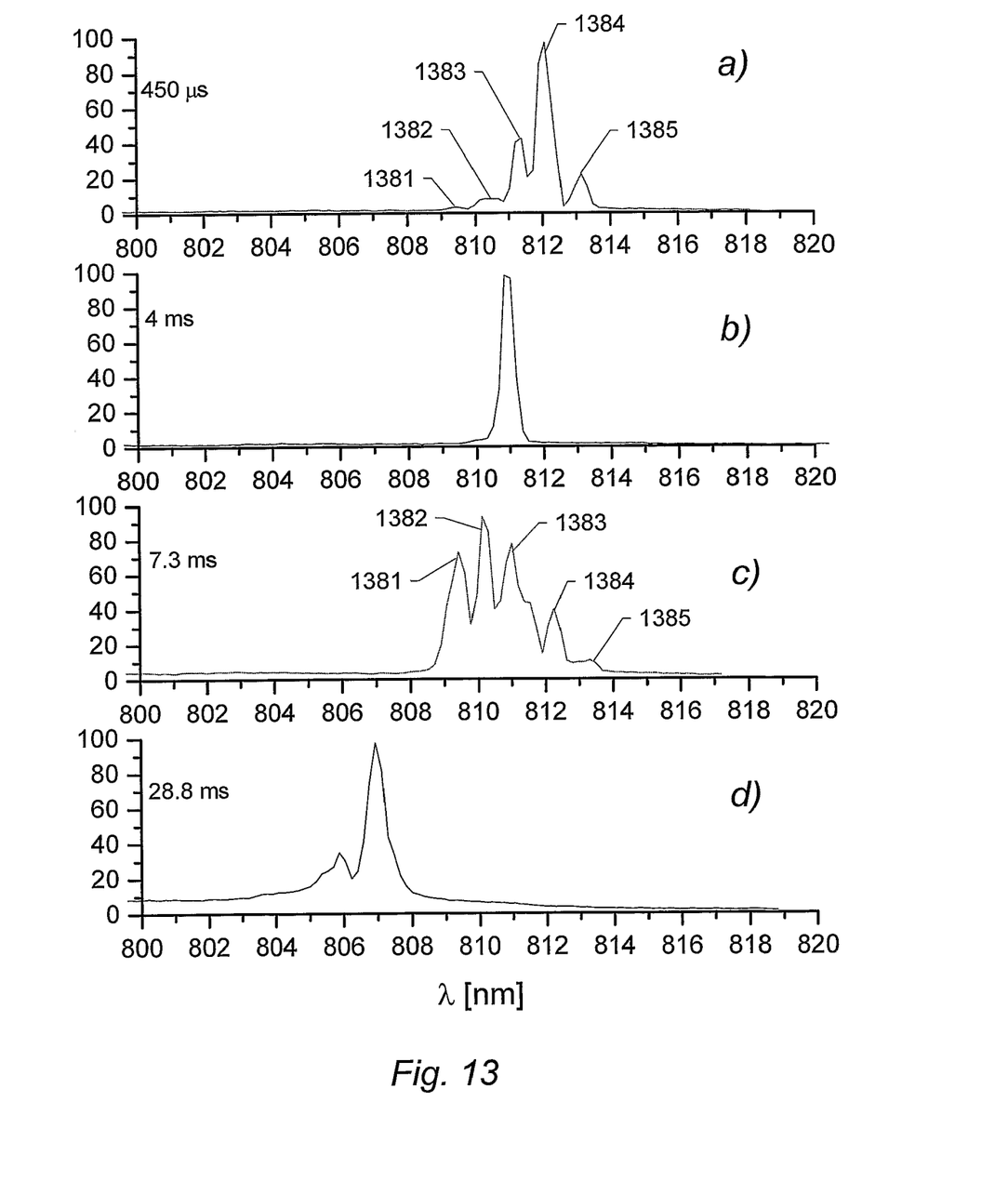
FIG. 13 shows the spectra of the output beam with and without feedback from the optical components and for the second drive current.

FIG. 13 shows the spectra of the zero-order beam with and without feedback from the optical components and for a drive current of I=1.6 A. The curves show beam intensities (in arbitrary units) vs. wavelength for the zero-order beam 543 in the setup of FIG. 5.

FIG. 13*a* shows the intensity vs. wavelength of the laser system with feedback from both the plane plate 232 and the mirror stripe 208. The curve shows five peaks 1381, 1382, 1383, 1384, 1385, as described above.

FIG. 13*b* shows the intensity vs. wavelength of the laser system with feedback from the mirror stripe 208 only, i.e. with the plane plate 232 removed. Since the plane plate was removed, the five peaks are not visible.

FIG. 13*c* shows the intensity vs. wavelength of the laser system with feedback from the plane plate 232 only, i.e. with the mirror 208 removed.

FIG. 13*d* shows the intensity vs. wavelength of the freely running laser, i.e. with both the plane plate 232 and the mirror 208 removed from the system.

Although preferred embodiments of the present invention have been described and shown, the invention is not restricted to them, but may also be embodied in other ways within the scope of the subject matter defined in the following claims.

The present invention may advantageously be applied in a variety of applications including the graphic industry, marking and engraving applications, dentistry, as a pump source for telecommunication lasers, wavelength multiplexing in optical communication systems, as a pump source for solid state lasers, material processing such as plastic welding and soldering, medical applications where coupling into thin core optical fibers is needed, etc.

In the device claims enumerating several means, several of these means can be embodied by one and the same item of hardware. The mere fact that certain measures are recited in mutually different dependent claims or described in different embodiments does not indicate that a combination of these measures cannot be used to advantage.

It should be emphasized that the term "comprises/comprising" when used in this specification is taken to specify the presence of stated features, integers, steps or components but does not preclude the presence or addition of one or more other features, integers, steps, components or groups thereof.

The invention claimed is:

1. A laser system, comprising:
a laser source which emits a laser beam, the laser source comprising a plurality of emitters for emitting respective beam contributions to the emitted laser beam, the emitted laser beam having a spatial light distribution around an optical axis of the emitted laser beam;
first and second optical feedback circuits defining respective first and second resonant cavities and providing optical feedback of respective first and second parts of the emitted laser beam back into the laser source at respective feedback angles relative to the optical axis; and
a Fourier lens located in the beam path of the emitted laser beam and defining a Fourier plane;
wherein the first optical feedback circuit comprises a first diffractive element generating a first diffracted beam from the first part of the emitted laser beam, the first diffractive element being positioned substantially in the Fourier plane, and a first reflective element reflecting a feedback part of the first diffracted beam back onto the first diffractive element and generating an output beam from an output part of the first diffracted beam, and a second spatial filter which blocks spatial modes of the first diffracted beam, the spatial modes corresponding to angular contributions having an angle relative to the optical axis smaller than a lower cut-off angle, and
wherein the second optical feedback circuit comprises a first spatial filter which prevents at least a central portion of the spatial light distribution proximal to the optical axis from being fed back into the laser source, a second diffractive element, and a second reflective element including a reflective surface area, the first spatial filter being formed by an edge portion of said reflective surface area proximal to the optical axis, the second diffractive element being positioned substantially in the Fourier plane of the Fourier lens, and the second reflective element being positioned in the beam path on one side of the optical axis such that the edge portion proximal to the optical axis has a predetermined angular distance from the optical axis.

2. The laser system according to claim 1, wherein the first optical feedback circuit feeds back a respective angular/directional contribution of each of said beam contributions into a corresponding one of the plurality of emitters from which said angular/directional contribution was emitted at a predetermined output angle, causing each of the plurality of emitters to emit a beam contribution towards the second optical feedback circuit at an angle corresponding to the predetermined output angle.

3. The laser system according to claim 1 or 2, wherein the first reflective element reflects at least a part of the first-order contribution of the first diffracted beam back onto the diffractive element.

4. The laser system according to claim 1, wherein the first diffractive element emits more optical power in the first-order contribution of the first diffractive beam than in the zero-order contribution of the first diffractive beam.

5. The laser system according to claim 1, wherein the first reflective element reflects a part of the first diffracted beam that is emitted from the first diffractive element at a predetermined angle.

6. The laser system according to claim 1, wherein the spatial distribution of the emitted laser beam is a combined intensity distribution pattern having multiple combined lobes corresponding to the multiple spatial lobes of the individual contributions, wherein the combined lobes are positioned off-axis on either side of the optical axis of the laser source, which optical axis projects substantially perpendicular out of an output face of the laser source.

7. The laser system according to claim 1, wherein the first diffractive element and the second diffractive element are embodied as a single diffractive element which diffracts the emitted laser beam resulting in a combined diffracted beam, the first reflective element being positioned in the path of a first lobe of the diffracted combined intensity distribution, and the second reflective element being positioned in the path of a second lobe of the combined intensity distribution on the opposite side of the optical axis from said first lobe.

8. The laser system according to claim 1, wherein the second optical feedback circuit including the first spatial filter feeds back one or more spatial modes of the emitted laser beam.

9. The laser system according claim 8, wherein the one or more spatial modes are one or more spatial modes that are present in the freely running laser.

10. The laser system according to claim 1, wherein the first spatial filter blocks a peripheral beam contribution corresponding to an angular beam contribution above a predetermined upper cut-off angle.

11. The laser system according to claim 1, wherein the first reflective element has a reflectivity between about 1-25%, and wherein the first reflective element substantially transmits the corresponding remaining fraction of the light that reaches the first reflective element as an output beam.

12. The laser system according to claim 11, wherein the first reflective element has a reflectivity of one from the group of about 1-5% and about 5-15%.

13. The laser system according to claim 1, wherein the second reflective element has a reflectivity larger than 95%.

14. The laser system according to claim 13, wherein the second reflective element has a reflectivity of one from the group of larger than 98% and larger than 99%.

15. The laser system according to claim 1, wherein the second optical feedback circuit comprises a second diffractive element generating a second diffracted beam from the second part of the emitted laser beam and the second reflective element reflects at least a part of the second diffracted beam back onto the second diffractive element.

16. The laser system according to claim 15, wherein the first and second diffractive members are the same diffractive member.

* * * * *